CONTACT SYSTEM FOR INTRICATE GEOMETRY DEVICES

Filed May 31, 1968

INVENTOR
John Philips

BY C. L. Menzemer
ATTORNEY

United States Patent Office 3,525,910
Patented Aug. 25, 1970

3,525,910
CONTACT SYSTEM FOR INTRICATE GEOMETRY DEVICES

John Philips, Monroeville, Pa., assignor to Westinghouse Electric Corporation, Pittsburgh, Pa., a corporation of Pennsylvania Filed May 31, 1968, Ser. No. 733,606
Int. Cl. H01l 3/00
U.S. Cl. 317—234 6 Claims

ABSTRACT OF THE DISCLOSURE

This invention provides a compression bonded encapsulation device in which one or more flat current conducting contact plates are pressed against one or both faces of a semi-conductor device to make contact to selected device areas which lie on the same device plane, while at the same time not contacting other selected areas of the device which lay on a different plane.

BACKGROUND OF THE INVENTION

This invention is concerned with pressure contacted, three contact semiconductor devices.

DESCRIPTION OF THE PRIOR ART

In the fabrication and encapsulation of three terminal semiconductor devices such as transistors and thyristors, one side of a wafer of semiconductor material is generally bonded to a heat sink for good thermal dissipation. Very often this side also serves as one of the high current terminals to the device.

The other side of the wafer has a more intricate geometry and requires two electrically isolated contacts to be made to it as for example, emitter and base contacts in a transistor and cathode and gate contacts on a thyristor.

One of these two contacts is usually a high current, greater than 5 amperes, contact, while the other contact is essentially an auxiliary contact and usually requires a current capability which is an order-of-magnitude less than the primary contact. Normally the contacts are made to the wafer by plating, evaporating or alloying to certain selected areas on the wafer surface. Leads of a proper size are then bonded to the contact area and the assembly encapsulated.

In most devices, wire leads are bonded or soldered to small areas of the contacts which are then expected to distribute the current uniformly over the active area of the device. When the current carrying capacity required approaches 5 to 10 amperes, multiple wire leads are often made to several areas in order to minimize lead voltage drop and current crowding effects.

However, this technique is troublesome, and no bonding techniques are known which can use thick wire leads to handle even higher currents.

In solving this problem, compression bonding has been found to be for power rectifiers and some thyristors.

The reason for this is that the geometry of these devices is such that two large metal pressure plates can be applied to the devices for high current contacts thus achieving uniform pressure of the wafer of semiconductor material with high current carrying capacity. This technique is quite simple in practice in that two flat metal surfaces are pressed against corresponding metallized device contact area. Such a device is shown in FIG. 1.

The prior art device 10 of FIG. 1 is a power rectifier. A wafer of semiconductor material 12 having a p-n junction 14 is positioned between two metal contacts 16 and 18 which in turn is disposed between pressure plates 20 and 22. A compressive means exerts its force on the flat portion 24 of plate 20 in the direction indicated by the arrows.

However, for devices having intricate geometries on one surface such as transistors and turn-off thyristors with interdigitated structures and circular or star patterns a simple pressure plate cannot be used since electrical isolation must be maintained between the two top contacts to prevent shorts.

One solution to this problem is to use a contact plate which is insulated and metallic electrodes are fastened to the insulating plate so that contacts are made to the correct areas on the wafer.

The appropriate metallized areas on the insulated pressure plates are then interconnected and a single lead brought out through the encapsulation. However, the contacts to the device are still crude in geometry and do not make contact to all of the desired area on the wafer. In such cases, the pressure is often uneven and this may crack the wafer.

An object of this invention is to provide a method for making a pressure electrical contact plate to a semiconductor device having an intricate geometric pattern of contacts to regions of a different type of semiconductivity exposed on at least one of its surfaces.

Other objects will, in part, be obvious and will, in part, appear hereinafter.

SUMMARY OF THE INVENTION

In accordance with the present invention there is provided a semiconductor device comprising a wafer of semiconductor material, said wafer having a top and a bottom surface, said wafer having two regions of opposite type of semiconductivity exposed on said top surface, electrical contacts affixed to each of the regions, said electrical contacts having top and bottom surfaces, the bottom surface of said contacts being affixed to the respective regions, a first plane defined by the top surface of the contacts affixed to one region being spaced above a second plane defined by the top surface of the contact affixed to the other region, a flat pressure plate in physical and electrical contact with only the surface defining said first plane.

BRIEF DESCRIPTION OF THE DRAWINGS

For a better understanding of the nature and objects of the invention, reference should be had to the following detailed description and drawing in which.

DESCRIPTION OF THE PREFERRED EMBODIMENT

The problem in making a good high current pressure contact to intricate geometry devices is that the two contact areas on the same face are normally on the same plane, and thus any flat pressure plate makes contact over the whole area. In order to eliminate this problem, the flat pressure plate must be used in combination with a device in which the main high current contact is on a first plane, and the auxiliary contact is on a second plane. The second plane usually being parallel to the first plane and below the first plane.

Figure 1:
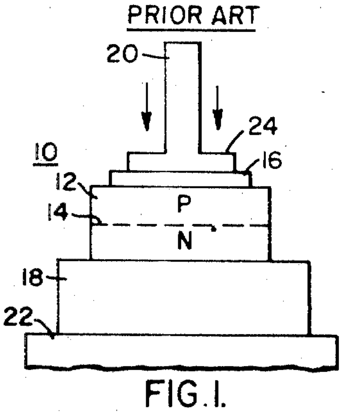
FIG. 1 is a side view, partially in cross-section, of a prior art device.
Figure 2:
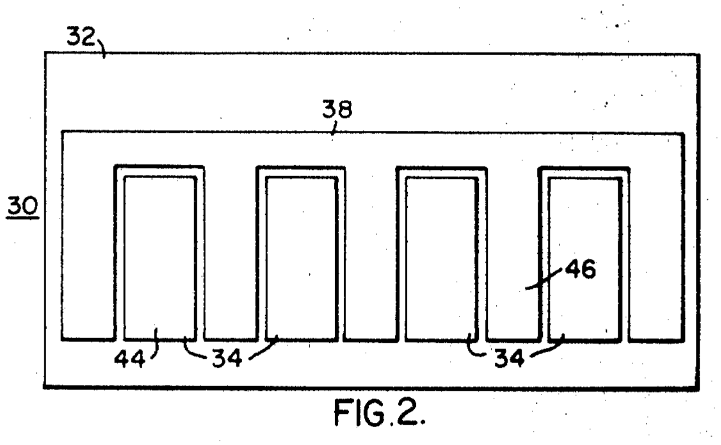
FIG. 2 is a top view of a device suitable for contacting in accordance with the teachings of this invention.
Figure 3:
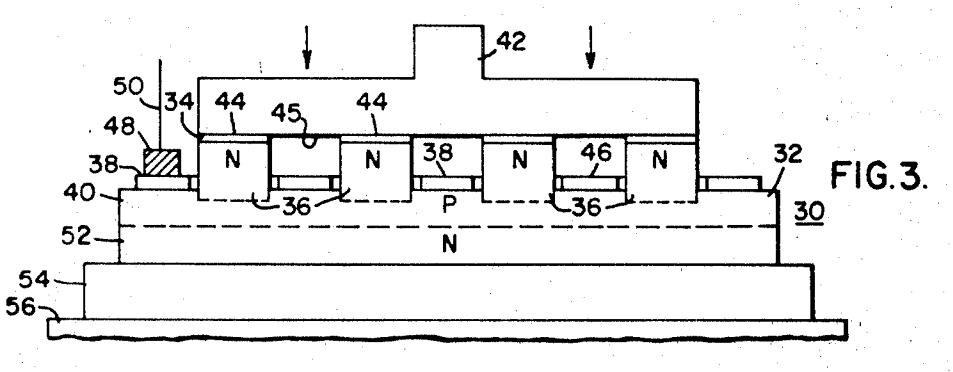
FIG. 3 is a side view of the device of FIG. 2.

With reference to FIGS. 2 and 3, there is shown top and side views respectively of a semiconductor device 30, a transistor, utilizing the teachings of this invention, having an intricate geometric contact pattern on its top surface 32.

The contacts on the top surface 32 of the device 30 consist of emitter contacts 34, the main contact, made to n-type emitter regions 36 and an interdigitated base contact 38, an auxiliary contact, made to p-type base region 40.

It is obvious that if the emitter contacts 34 and the base contact 38 were on the same plane flat pressure contact plate 42, through which a compressive force is applied in the direction indicated by the arrows, would contact both main contact, the emitter contact and the auxiliary contact, the base contact, and an electrical short would occur.

However, if a plane formed by top surfaces 44 of the emitter contacts 34 is from 0.5 mil to 2 mils above a plane defined by top surfaces 46 of the auxiliary base contacts 38, flat surface 46 of the flat pressure contact plate 42 can make contact with the emitter contacts 34 without being in physical or electrical contact with base contact 38.

A lead 48 can be made to any convenient portion of the base contact 38 and a lead-in wire 50 employed to make the necessary electrical connection to a power source (not shown).

Collector region 52 is held in electrical contact with a metal plate 54 and a base member 56 by the compressive force exerted through member 42.

The arrangement is satisfactory when the potential difference between emitter contacts 34 and base contact 38 does not exceed about 10 volts under all conditions of operation.

Figure 4:
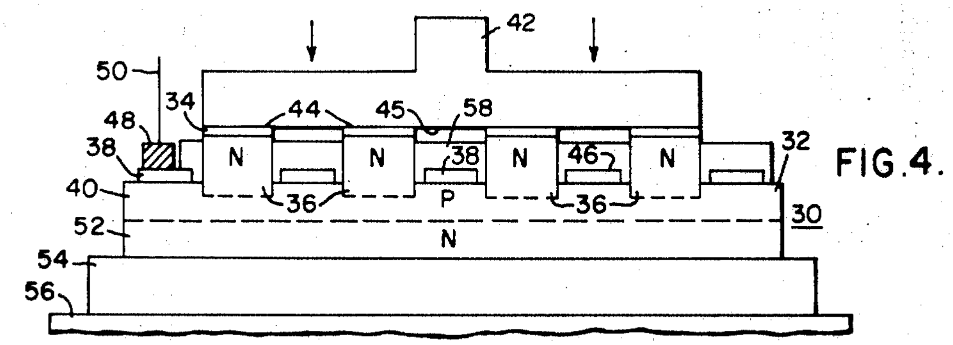
FIG. 4 is a side view, partially in section, of a device contacted in accordance with the teachings of this invention.

With reference to FIG. 4, if the device of FIGS. 2 and 3 is to be operated at a high potential a layer 58 of an insulating material, as for example silicon dioxide, can be applied to the top surface 46 of the base contact to prevent any creepage currents, arcing or shorting. Of course, one portion of contact 38 will be left exposed to facilitate making electrical contact to the base region 40.

The device of FIGS. 2, 3 and 4 can be made by diffusion and then etching away a portion of the emitter region to expose the base region or the emitter region can be formed together with contacts by alloying. Or, the emitter contacts can be formed by alloying and the base contacts can be formed by evaporating or sputtering or any combination of the methods can be employed.

Figure 5:
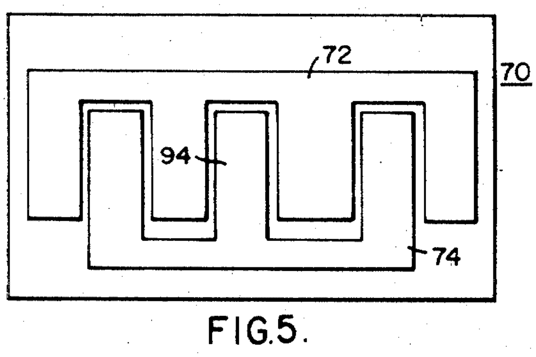
FIG. 5 is a top view of a device suitable for contacting in accordance with the teachings of this invention.

With reference to FIG. 5, there is shown a top view of a device 70 which may be either a transistor or a thyristor in which both the main contact 72, which is the emitter contact and the auxiliary contact 74, which is a base contact in a transistor and a gate contact in a thyristor, are both interdigitated.

The device 70 would be prepared as described above wherein a plane formed by top surfaces of the emitter contact 72 are 0.5 to 2 or more mils above a plane formed by top surfaces of the auxiliary contact 74.

Figure 6:
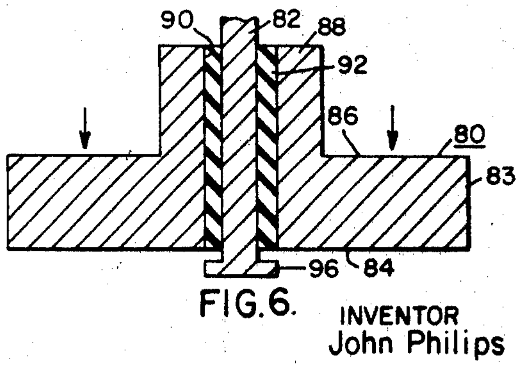
FIG. 6 is a side view of a pressure contact suitable for use with the device of FIG. 5.

In making contact to such a device a pressure contacting means of the type shown in FIG. 6 can be employed.

The means consists of a main pressure plate 80 and an auxiliary pressure plate 82.

The main pressure plate has a horizontal portion 83 with a flat surface 84 which is held in an electrically conductive relationship with the emitter contacts 72 of the device 70 of FIG. 6 by compression means being exerted in the direction indicated by the arrows against surface 86. The main pressure plate 80 also has a vertical portion 88.

There is an aperture 90 extending entirely through the vertical portion 88 and the horizontal portion 83. A layer 92 of an electrical insulating material as, for example, polytetrafluoroethylene or polytrifluoromonochloroethylene is disposed about the periphery of the aperture and the auxiliary inserted in the aperture. The auxiliary pressure plate 82 has a flat portion 92 which makes electrical contact with portion 94 of auxiliary contact 74.

The teachings of this invention are applicable to all semiconductor devices and other electronic devices having intricate geometric contact patterns on one or more surfaces and requiring high current leads to one or more of the contact areas.

While the invention has been described with reference to particular embodiments and examples, it will be understood, of course, that modifications, substitutions and the like may be made without departing from its scope.

I claim as my invention:

1. A semiconductor device comprising a wafer of semiconductor material, said wafer having a top and a bottom surface, said wafer having two regions of opposite type of semiconductivity exposed on said top surface, electrical contacts affixed to each of the regions, said electrical contacts having top and bottom surfaces, the bottom surfaces of said contacts being affixed to the respective regions, a first plane defined by the top surface of the contact affixed to one region being spaced above a second plane defined by the top surface of the contact affixed to the other region, and a flat pressure plate in physical and electrical contact with only the surface defining said first plane.

2. The device of claim 1 in which said first plane is at least 0.5 mil above said second plane.

3. The device of claim 1 in which a second flat pressure plate is in physical and electrical contact with only the surface defining said second plane.

4. The device of claim 1 in which at least one of the contacts is of the interdigitated type.

5. The device of claim 1 in which an electrical wire contact is made to an area of the contact defining said second plane.

6. The device of claim 5 in which the remaining top surface of the contact forming the second plane is covered with an electrical insulating material.

References Cited

UNITED STATES PATENTS

| | | | |
|---|---|---|---|
| 2,930,950 | 3/1960 | Teszner | 317—235 |
| 3,191,070 | 6/1965 | Jones et al. | 317—235 X |
| 3,309,585 | 3/1967 | Forrest | 317—234 |

JAMES D. KALLAM, Primary Examiner

U.S. Cl. X.R.

317—235